United States Patent [19]
Nelson

[11] Patent Number: 5,357,208
[45] Date of Patent: Oct. 18, 1994

[54] BOOST FUNCTION FOR FILTERS
[75] Inventor: Dale H. Nelson, Shillington, Pa.
[73] Assignee: AT&T Bell Laboratories, Murray Hill, N.J.
[21] Appl. No.: 37,210
[22] Filed: Mar. 26, 1993
[51] Int. Cl.$^5$ .............................................. H03F 3/68
[52] U.S. Cl. ..................... 330/126; 330/306; 307/520; 328/127
[58] Field of Search ............... 330/126, 306; 307/520; 328/127; 333/172

[56] References Cited
FOREIGN PATENT DOCUMENTS
2243966 11/1991 United Kingdom ............... 307/520

Primary Examiner—James B. Mullins
Assistant Examiner—Jim Dudek
Attorney, Agent, or Firm—David L. Smith

[57] ABSTRACT

An integrated circuit is disclosed that includes a biquadratic filter in which the poles and zeroes are independently adjustable. The transfer function of the filter has a pair of zeroes in the numerator and a pair of complex conjugate poles in the denominator. The integrated circuit includes a first circuit for constructing the complex conjugate poles of the filter transfer function. The first circuit has an input port for receiving an input signal and an output port at which an output current representative of a filtered output signal is presented. The integrated circuit includes a second circuit for constructing, independently of the poles, the zeroes of the filter transfer function. The second circuit has an input port coupled to the input port of the first circuit for receiving the input signal. The second circuit includes a differentiator for differentiating the input signal to produce a differentiated input signal. The second circuit provides an output current that is proportional to the differentiated input signal. The output current from the second circuit is summed with the output current of the first circuit to produce the filtered output signal. Disk drive controllers that utilize integrated circuits including this technique have the advantage of using a single filter over the entire frequency range with the flexibility of independently varying poles and zeroes of the filter. The biquadratic filter is particularly useful in systems that have a variable rate of encoding digital information so as to record data in a constant bit density.

31 Claims, 2 Drawing Sheets

BOOST FUNCTION FOR FILTERS

TECHNICAL FIELD

This invention relates generally to integrated circuits having a filter and particularly to integrated circuits providing boost in a filter, and systems utilizing such circuits.

BACKGROUND OF THE INVENTION

Disk drives write either a +1 or a −1 by orienting the spins of magnetic domain particles on a disk in one direction or the opposite direction. When data is read from the disk, a read head senses the transition of the spins from orientation in a first direction to orientation in a second, opposite direction as a bit boundary peak. The bit boundary peaks of the sensed signal represent the spatial positions where the transitions occur on the disk. The signal sensed by the disk read head is analyzed by a pulse detector circuit to identify the spatial relationship between a bit boundary peak in a first direction and a bit boundary peak in a second direction. The elapsed time represented by the spatial relationship between successive bit boundary peaks indicates how long the digits were written on the disk in one direction or the other, and thus how many 1's and −1's were stored and read.

Noise can obfuscate the location of a peak in a signal. Therefore, the signal from the read head is filtered to band limit the frequencies in the filtered signal and enhance the accuracy of the peak detection. A filter that introduces a pure group delay does not increase the difficulty of extracting spatial information from the filtered signal as the entire signal, and thus relative signal characteristics, are all shifted the same amount of time. However, if the filter introduces a change in the distance between the bit boundary peaks, the spatial relationship between a bit boundary peak in one direction and a bit boundary peak in the opposite direction would be impaired. As a result, it may not be possible to accurately determine how many digits were stored. Thus, the filter must preserve the relative spatial peak-to-peak location by not introducing a phase change.

As disk storage densities increase, magnetic domains become smaller and smaller and bit boundary peaks are packed closer and closer together. When bit boundary peaks are packed closer together, the peaks have a smaller amplitude, and the bit boundary peaks interfere with adjacent peaks, resulting in distorted bit boundary peak positions. The distortion is compensated for through a write predistortion to yield bit boundary peaks during a disk read operation at desired relative locations. The band limiting filter is also used to introduce an increase in magnitude without a change in phase, called boost, to the filtered signal.

A polynomial filter can be synthesized by factoring the polynomial into a product of terms, typically quadratic, with each quadratic term implemented in cascade. The cascade implementation is functionally equivalent to multiplication in the frequency domain or a convolution in the time domain.

A biquadratic filter has typically been used to introduce boost. The term biquadratic identifies that there is a quadratic expression in both the numerator and denominator of the mathematical expression defining the filter. A biquadratic filter has been used because poles and zeros occur in pairs, and quadratic terms are readily implemented to realize a filter. Designing higher order filters by using a cascade of successive biquadratic filter sections is well known.

A filter implemented using transconductance cells is shown in J. M. Khoury's "Design of a 15-MHz CMOS-time Filter with On-chip Tuning," IEEE Journal of Solid State Circuits, Dec. 19, 1991, Vol. 26, No. 12, pp. 1988–1997. Transconductance cells can also be used to realize a biquadratic filter.

A traditional method to provide boost in a biquadratic filter uses the generalized biquadratic structure shown as prior art in FIG. 3. This structure is shown by Geiger, R. L. and Sanchez-Sinencio, E., IEEE Circuits and Devices Magazine, Mar. 19, 1985, pp. 20–32, at p. 28. The output voltage $V_o$ is described by the following equation:

$$V_o = \frac{s^2 C_1 C_2 V_C + s C_1 G_{M4} V_B + G_{M2} G_{M5} V_A}{s^2 C_1 C_2 + s C_1 G_{M3} + G_{M2} G_{M1}}$$

To eliminate the first order term in the numerator so as to have a quadratic term factorable into two complex conjugate roots, $V_B$ is set to zero. Boost is achieved by making input $V_C$ proportional to the negative of input $V_A$, and then controlling the level of input $V_A$. The lower plate of capacitor $C_2$ is driven by a voltage source, $V_C$, that is proportional to input $V_A$.

Another known method to introduce boost in a disk drive filter is to take the higher order frequency domain equation of a disk drive filter and factor the equation into lower order terms. Each of the second order numerator terms factors into two terms from which two roots are identified. Each of the two roots is placed in a different biquadratic section of the filter. Mathematically, the same results are achievable as with the FIG. 3 circuit. A problem with this design is that the gains that must be established to define the numerator roots (zeros) are independent. For the phase of the two roots to cancel, the positions of the roots must be maintained at mirror image locations across the imaginary axis in the frequency domain. Since the gain achieved in the two biquadratic sections will approximate the gains necessary to precisely locate the zeros at mirror image locations, but in practice will not be exact, the phase delay introduced by each zero in the passband of the filter will not cancel. A net phase shift will be introduced, along with an incorrect amplitude, resulting in both an amplitude distortion and nonuniform group delay which are not characteristics of the desired boost.

It is desired to have a filter introduce boost into a signal passing therethrough such that the contribution of the filter zeros to the phase shift in the filter passband cancel. In this manner, the filter zeroes introduce only the desired amplitude increase known as boost. It is further desired for the boost setting to be independent of the filter pole frequencies, such that variations in the boost setting does not change the pole frequencies of the filter and scaling in the pole frequencies does not change the boost setting.

SUMMARY OF THE INVENTION

In accordance with an embodiment of the invention, an integrated circuit includes a biquadratic filter. The transfer function of the filter has a pair of zeroes in the numerator and a pair of complex conjugate poles in the denominator. The integrated circuit includes a first circuit for constructing the complex conjugate poles of the filter transfer function. The first circuit has an input port for receiving an input signal and an output port at which an output current representative of a filtered output signal is presented. The integrated circuit includes a second circuit for constructing, independently of the poles, the zeroes of the filter transfer function. The second circuit has an input port coupled to the input port of the first circuit for receiving the input signal. The second circuit includes a differentiator for differentiating the input signal to produce a differentiated input signal. The second circuit provides an output current that is proportional to the differentiated input signal. The output current from the second circuit is summed with the output current of the first circuit to produce the filtered output signal. Disk drive controllers that utilize integrated circuits including this technique have the advantage of using a single filter over the entire frequency range with the flexibility of independently varying the poles and zeroes of the filter. The advantage is most useful in systems that have a variable rate of encoding digital information so as to record data in a constant bit density.

DETAILED DESCRIPTION

Figure 1:
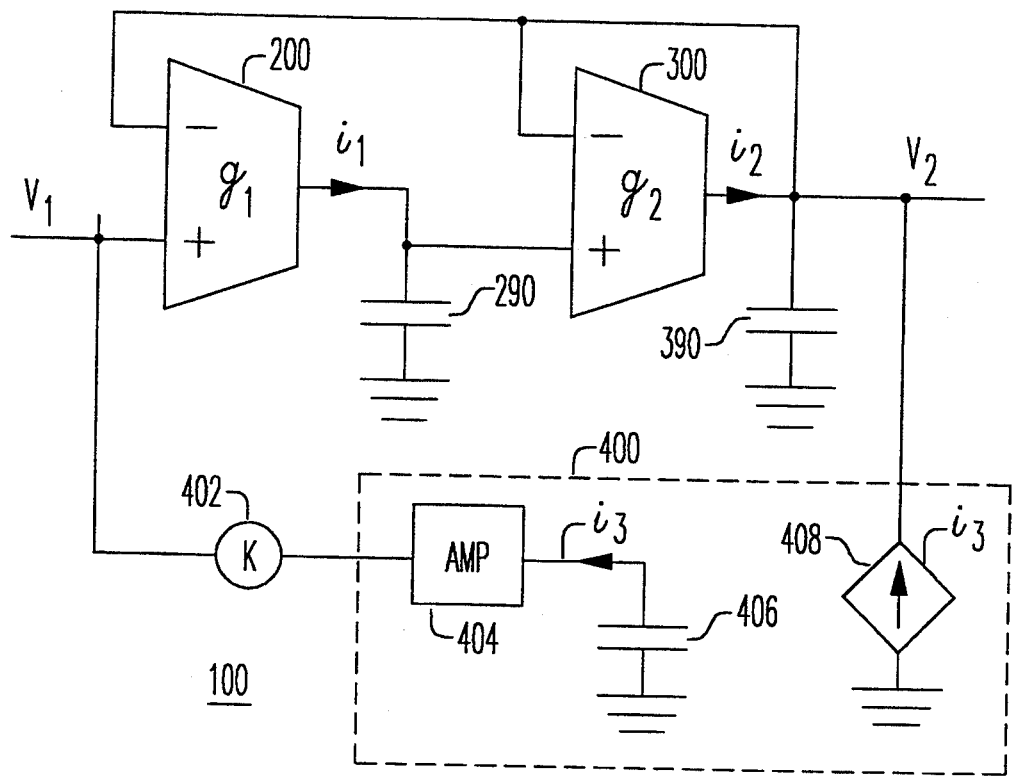
FIG. 1 is a schematic diagram showing the environment in which a preferred embodiment of the invention may be used.
Figure 3:
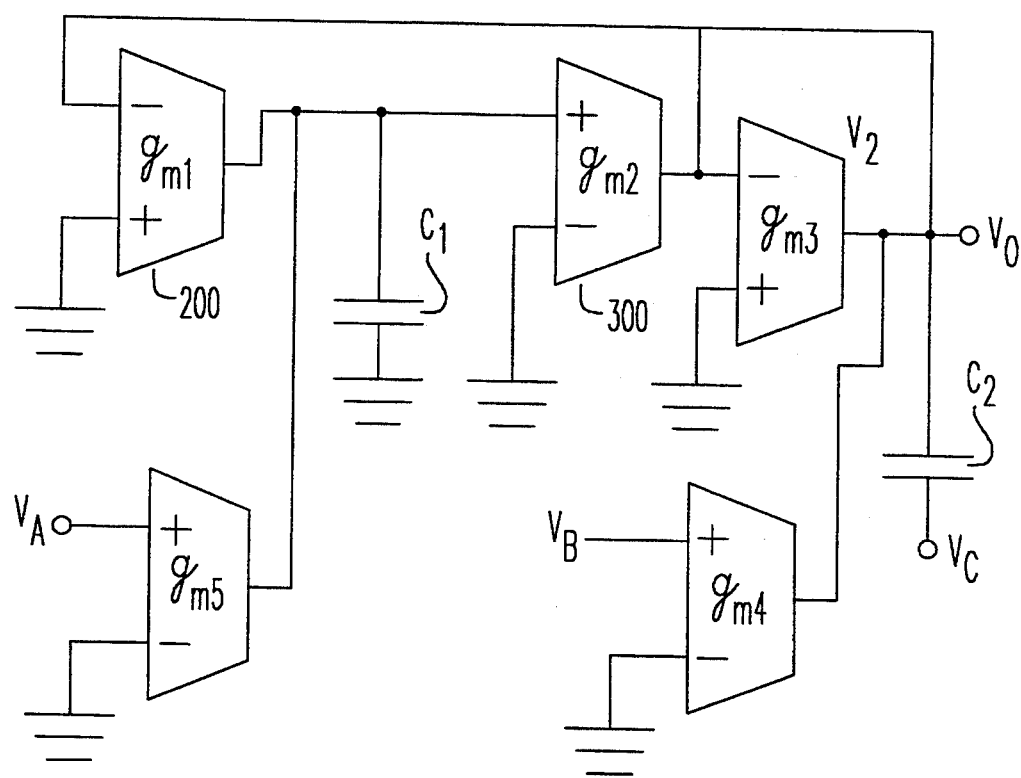
FIG. 3 of a schematic diagram of a prior art biquadratic circuit.

An overview of the environment in which integrated circuits using the invention may be used is shown in the simplified schematic diagram of FIG. 1. Biquadratic filter 100 includes a pair of cascaded amplifiers 200 and 300 and differentiation cell 400 connected between the input and output of the cascaded pair of amplifiers. More specifically, Biquadratic filter 100 receives an input signal $V_1$ as the positive input of transconductance amplifier 200. The output of amplifier 200 is coupled to both capacitor 290 and the positive input to transconductance amplifier 300. The output of amplifier 300 provides the negative input to both amplifiers 200 and 300. The output of amplifier 300 is also coupled to capacitor 390 and differentiation cell 400. The output of amplifier 300 is also the output from filter 100.

The differentiation cell 400 receives the input signal $V_1$ through gain element 402, such as an attenuator. Differentiation cell 400 includes high input and high output impedance wideband amplifier 404 coupled to gain element 402 driving a capacitor 406 to produce a differentiated current $i_3$. Current source 408 duplicates the differential current $i_3$ and provides the output from differentiation cell 400 to drive node $V_2$.

Figure 2:
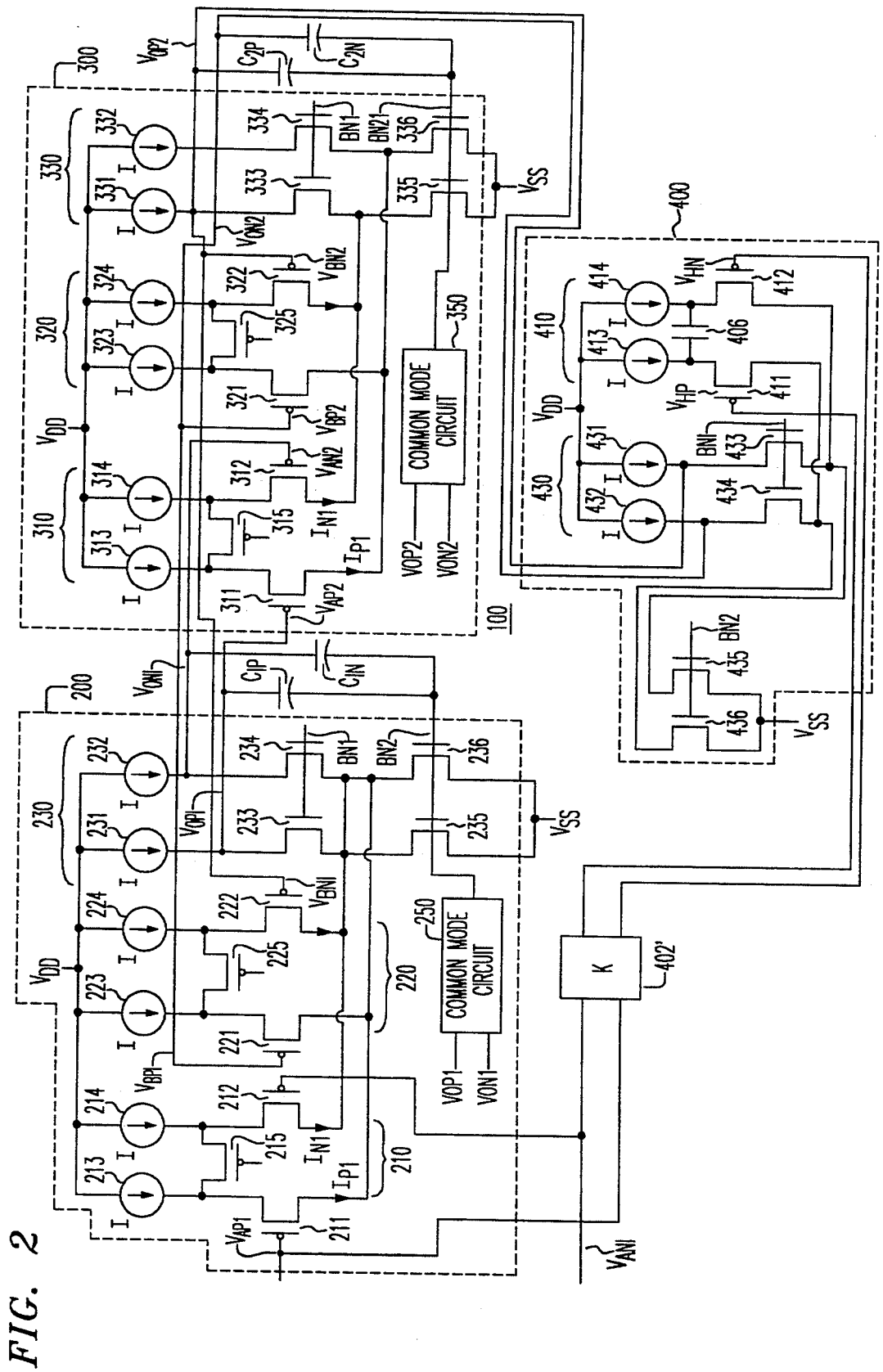
FIG. 2 is a schematic diagram showing the circuit of FIG. 1 in greater detail and in differential signal mode.

FIG. 2 shows the same circuit as FIG. 1 in a fully balanced, or fully differential, design. The fully balanced design eliminates unwanted coupling into the circuit with any coupling input, such as from the power supply ripple, provided equally to both inputs with the result that coupling will cancel. The fully balanced design also provides better linearity for the chosen transconductance used in the filter.

Transistors 211, 212, and 215 along with current sources 213 and 214 comprise a first input stage 210 to cell 200. Input signals $V_{AP1}$ and $V_{AN1}$ are coupled to the gates of transistors 211 and 212, respectively. Current sources 213 and 214 provide a relatively constant current (I) through respective transistors 211 and 212. Transistor 215, connected between the source electrode of transistor 211 and the source electrode of transistor 212, operates in the resistive (triode) region of its characteristic curve. The basic transconductance ($g_m$) of the first input stage 210 is set by the transconductance of transistor 215. The use of more than one transconductance transistor is possible as shown in the above-cited Khoury article. In the fully balanced structure, the resulting currents $I_{P1}$ and $I_{N1}$ supplied to the output stage 230 are calculated as:

$$I_{P1} - I_{N1} = -g_mX(V_{AP1} - V_{AN1}).$$

Current $I_{P1}$ is the bias current provided by current source 213 less the current through transistor 215 from the AP side and added to the AN side. The current $I_{N1}$ is the bias current provided by current source 214 plus the current through transistor 215 from the AP side.

Transistors 221, 222, and 225 along with current sources 223 and 224 comprise a second input stage 220 to cell 200. Input signals $V_{BP1}$ and $V_{BN1}$ are applied to the gates of transistors 221 and 222 respectively. Current sources 223 and 224 provide a relatively constant current through respective transistors 221 and 222. Transistor 225, connected between the source electrode of transistor 221 and the source electrode of transistor 222, operates in the resistive region of its characteristic curve. The basic transconductance of second input stage 220 is set by the transconductance of transistor 225. The currents supplied to the output stage 230 by second input stage 220 can be calculated in the same manner as the currents supplied by first input stage 210.

Currents from first input stage 210 and second input stage 220 are supplied to the output stage 230, comprising current sources 231 and 232 as well as transistors 233, 234, 235, and 236 in the illustrative embodiment of FIG. 2. The output stage is biased by voltages BN1 and BN2. The output signals $V_{OP1}$ and $V_{ON1}$ are produced by output stage 230. In operation, it can be seen that a more positive voltage on the gate of transistor 211 causes $I_{P1}$ to decrease and $I_{N1}$ to increase, which in turn causes $V_{OP1}$ to increase and the $V_{ON1}$ to decrease. Conversely, a more positive $V_{AN1}$ causes $V_{OP1}$ to decrease and $V_{ON1}$ to increase. In the embodiment shown, the first input stage 210 is implemented with P-channel transistors and the output stage 230 is implemented with N-channel transistors. However, other combinations of transistor types are possible, with corresponding changes to the output voltages as a function of the input voltages.

The differential outputs from output stage 230 are $V_{OP1}$ and $V_{ON1}$ which are also the outputs from cell 200. The outputs $V_{OP1}$ and $V_{ON1}$ from cell 200 are coupled respectively to a first plate of capacitors $C_{1P}$ and $C_{1N}$. The second plate of each capacitor is coupled to common mode circuit 250. Common mode circuit 250, which also receives differential output signals $V_{OP1}$ and $V_{ON1}$ as input signals, controls the average DC voltage cell 200 operates around, called the common mode voltage, which includes feedback to set and maintain a predetermined common mode voltage. Common mode circuit 250 also functions as a ground for any AC signal. As compared to FIG. 1, in this embodiment two capacitors are required due to the circuit operating in a differential mode. Capacitors $C_{1P}$ and $C_{1N}$ are of the same magnitude of capacitance as capacitor 290 in the embodiment of FIG. 1.

The differential outputs from cell 200 also provide the differential inputs to cell 300. Since cells 200 and 300 are identical in structure, the artisan will understand the operation of cell 300 by the above description of cell 200. Each of cell 200 and 300 implement one term of a biquadratic filter.

The differential outputs from stage 330 are $V_{OP2}$ and $V_{ON2}$ which are also the outputs from cell 300 and the differential outputs from filter 100. The outputs $V_{OP2}$ and $V_{ON2}$ from cell 300 are coupled to a first plate respectively of capacitors $C_{2P}$ and $C_{2N}$. The second plate of each capacitor is coupled to common mode circuit 350, which also receives differential output signals $V_{OP2}$ and $V_{ON2}$ as input signals. Common mode circuit 350 controls the average DC voltage cell 300 operates around, called the common mode voltage, which includes feedback to set and maintain a predetermined common mode voltage. Common mode circuit 350 also functions as a ground for any AC signal. Capacitors $C_{2P}$ and $C_{2N}$ are of the same magnitude of capacitance as capacitor 390 in the embodiment of FIG. 1.

Differential inputs $V_{AP1}$ and $V_{AN1}$ provided as inputs to cell 200 are also provided as inputs to differential attenuator 402'. Differential attenuator 402' when a passive attenuator has a magnitude that can range from zero to one. Implementing differential attenuator 402' as an amplifier would provide for gains greater than one. The sign of gain K determines whether the filter introduces boost or a notch. When the sign of gain K is negative, boost is introduced. When the sign of gain K is positive, a decrease in amplitude with a sharp 180 degree phase shift, called a notch, is introduced in the filtered signal.

Those skilled in the art could readily fabricate a circuit to vary gain K electronically. In varying the amplitude of gain K, the frequency plane location of the pair of zeroes is simultaneously varied, with the frequency plane location of the poles of the filter remaining unchanged. The zeroes shift in the frequency plane but are maintained at precise mirror image locations across the imaginary axis as one zero is the negative of the other. This assures the phase delay introduced by one zero is precisely offset or canceled by the phase delay introduced by the other zero. Gain K may be varied from one disk drive application to another such as to accommodate differing data rates. Within a single disk drive application, gain K is varied to accommodate pulse shapes and interaction between pulses on concentric tracks of different diameters.

Varying gain K changes the bandwidth of the filter but does not change the poles of the filter; the poles are independent of gain K. To vary the poles of the filter, the transconductance of cells 200 and 300 are changed, which can be achieved by varying the voltage applied to the gate electrode of transistors 215, 225, 315 and 325. A biquadratic filter designed in accordance with the present invention is functional over several frequency ranges, a feature particularly useful because both the gain K, and the transconductance of the cells of the biquadratic filter are electronically adjustable.

The differential inputs $V_{AP1}$ and $V_{AN1}$ provided as inputs to cell 200 are also provided as inputs to differentiation cell 400 as attenuated by differential attenuator 402'. Differentiation cell 400 is a differential circuit similar to cells 200 and 300 with the triode device in a stage replaced with capacitor 406. Input stage 410 differentiates the differential input signal and provides a differential current to output stage 430 representative of the derivative of the differential input signal voltage. Output stage 430, which operates in the same manner as output stage 230, may or may not be present. Output stage 430, when present, adds the output of input stage 410 to the output of output stage 330, which is also the output from filter 100. When output stage 430 is not present, output stage 330 adds the output of stage 410 directly to the output from output stage 330 to produce the output of filter 100.

In this manner, the gain of filter 100 is a current amplified gain, the magnitude of which is the ratio of capacitances of capacitors 406 and 390 in the FIG. 1 embodiment, or the ratio of capacitances of capacitor 406 and either capacitors $C_{2P}$ or $C_{2N}$ in the embodiment of FIG. 2. In a preferred embodiment, the ratio of capacitances is about eight to one.

The invention is particularly useful in disk drive controllers employing integrated circuits including this technique, especially in systems that have a variable rate of encoding digital information so as to record data in a constant bit density. Such disk drive controllers have the advantage of using a single filter over the entire frequency range with the flexibility of independently varying the gain and pole frequencies of the filter.

While the invention has been shown in conjunction with a two-stage filter, the invention could be used with a multiple-stage filter. Furthermore, while amplifiers in the embodiment of FIG. 1 have been shown as operational transconductance amplifiers, the invention is not limited thereto. Although the FIG. 2 embodiment of the invention has shown the use of field effect devices as the input transistors, the use of bipolar type transistors is alternatively possible. In that case, the transconductance transistor may still be of the field effect type, and the circuit may be implemented on a single integrated circuit chip with BICMOS technology, for example.

I claim:

1. An integrated circuit including a biquadratic filter the transfer function of which has a pair of zeroes in the numerator and a pair of complex conjugate poles in the denominator, the biquadratic filter for receiving an input signal and providing a filtered output signal, the integrated circuit comprising:

a first circuit for constructing the complex conjugate poles of the filter transfer function, the first circuit responsive to the input signal and having a first input port for receiving the input signal, the first circuit having an output port at which an output current signal is presented, the output port coupled to a first capacitor, the first capacitor having first and second plates, the first plate coupled to the output port, the second plate coupled to a reference voltage;

a second circuit for constructing the zero pair of the filter transfer function independence of the poles, the second circuit having an input coupled to the first input port of the first circuit for receiving the input signal, the second circuit including a differentiator for differentiating the input signal to produce a differentiated input signal, the second circuit providing an output current summed with the output current of the first circuit to produce the filtered output signal, the second circuit output current being proportional to the differentiated input signal, whereby the filter pole frequencies determined by the first circuit are independent of the filter gain determined by the second circuit.

2. An integrated circuit as recited in claim 1, wherein the first circuit further comprises first and second stages, the output of the first stage coupled as the input of the second stage.

3. An integrated circuit as recited in claim 2, wherein at least one of the first and second stages comprises a transconductance amplifier.

4. An integrated circuit as recited in claim 1, further comprising a second capacitor, the second capacitor in the second circuit driven by the input signal, whereby the output current of the second circuit is a derivative of the input signal.

5. An integrated circuit as recited in claim 1, wherein the reference voltage is a common mode reference circuit.

6. An integrated circuit as recited in claim 1, further comprising an attenuator in the second circuit interposed between the input and the differentiator, the attenuator introducing attenuation, whereby the attenuation controls the relative location of the zero pair.

7. An integrated circuit as recited in claim 6, wherein the attenuation is variable.

8. An integrated circuit as recited in claim 6, wherein the attenuator introduces a negative gain, whereby the magnitude of the gain determines the magnitude of boost.

9. An integrated circuit as recited in claim 6, wherein the attenuator introduces a positive gain resulting in a notch, whereby the magnitude of the gain determines the magnitude of the notch.

10. An integrated circuit, comprising:
a biquadratic filter having a first cell and a second cell, each cell having first and second input ports and an output port, the first cell for receiving an input signal at the first input port thereof and for providing an output signal at the output port thereof, the second cell having the first input port thereof coupled to the output port of the first cell for receiving as a first input signal the output signal from the first cell, the second cell providing at the output port thereof an output signal, the output port of the second cell coupled to the second input port of the first and second cells to provide the output signal from the second cell as a second input signal to the first and second cells, the biquadratic filter having a first capacitor with a first plate and a second plate, the first plate coupled to the output port of one of said first cell or said second cell, the second plate coupled to a reference voltage; and
a differentiation cell for receiving the input signal as an input, the differentiation cell having an output coupled to the output port of the second cell, the differentiation cell driving a capacitive load and providing at the output thereof a current proportional to the derivation of the input signal voltage.

11. An integrated circuit as recited in claim 10, wherein at least one of the first and second cells comprises a transconductance amplifier.

12. An integrated circuit as recited in claim 10, further comprising a second capacitor, the second capacitor having a first plate coupled to the output port of the other one of said first and second cells, and a second plate coupled to a reference voltage.

13. An integrated circuit as recited in claim 12, wherein the differentiation cell capacitive load comprises a third capacitor, the proportionality of the differentiation cell output current to the differentiation cell input signal being a ratio of capacitances of the capacitor coupled to the output port of the second cell and third capacitor.

14. An integrated circuit as recited in claim 13, wherein the ratio of capacitances is about eight.

15. An integrated circuit as recited in claim 10, further comprising an attenuator interposed between the first input port of the first cell and the differentiation cell, the attenuator introducing attenuation, whereby the attenuation controls the relative location of a zero pair.

16. An integrated circuit as recited in claim 15, wherein the attenuator introduces a negative gain, whereby the magnitude of the gain determines the magnitude of boost.

17. An integrated circuit as recited in claim 15, wherein the attenuator introduces a positive gain resulting in a notch, whereby the magnitude of the gain determines the magnitude of a notch.

18. An integrated circuit as recited in claim 10, further comprising:
an output stage interposed between the differentiation cell and the capacitive load.

19. An integrated circuit as recited in claim 10, wherein the reference voltage is a common mode circuit.

20. An integrated circuit including a biquadratic filter the transfer function of which has a pair of zeroes in the numerator and a pair of complex conjugate poles in the denominator, the biquadratic filter for receiving an input signal and providing a filtered output signal, the integrated circuit comprising:
a first circuit for constructing the complex conjugate poles of the filter transfer function, the first circuit having an input for receiving the input signal and an output at which an output current representative of a filtered signal is presented, the first circuit having first and second operational transconductance amplifiers, each of said first and second transconductance amplifiers having first and second input ports and an output port, the first transconductance amplifier receiving the input signal at the first input port thereof and providing an output signal at the output port thereof, the second transconductance amplifier having the output port of the first transconductance amplifier coupled to the first input port thereof for receiving at the first input port the output signal from the first transconductance amplifier, the second transconductance amplifier providing at the output port thereof an output signal including an output current, the output port of the second transconductance amplifier coupled to the second input port of both the first and second transconductance amplifiers to provide the output signal from the second transconductance amplifier as a second input to both the first and second transconductance amplifiers, the first circuit including a capacitor having a first plate and a second plate, the first plate coupled to the output port of one of said first or second transconductance amplifiers, the second plate coupled to a reference voltage; and
a second circuit for constructing the pair of zeroes of the filter transfer function, independent of the poles, the second circuit having an input coupled to the first input port of the first circuit for receiving the input signal, the second circuit including a differentiator for differentiating the input signal to produce a differentiated input signal, the second circuit providing an output current summed with the output current of the first circuit to produce the filter output, the second circuit output current being proportional to the differentiated input signal, whereby the filter pole frequencies determined by the first circuit are independent of the filter gain determined by the second circuit.

21. An integrated circuit as recited in claim 20, further comprising an attenuator interposed between the input and the differentiator, the attenuator introducing attenuation, whereby the attenuation controls the relative location of the zero pair.

22. An integrated circuit as recited in claim 21, wherein the attenuator introduces a negative gain, whereby the magnitude of the gain determines the magnitude of boost.

23. An integrated circuit as recited in claim 21, wherein the attenuator introduces a positive gain resulting in a notch, whereby the magnitude of the gain determines the magnitude of a notch.

24. An integrated circuit as recited in claim 20, further comprising a first capacitor driven by the output of the filter, and a second capacitor in the second circuit driven by the input signal, whereby the output current of the second circuit is a derivative of the input signal.

25. An integrated circuit as recited in claim 24, wherein the proportionality of the output current to the differential input signal is a ratio of capacitances of the first and second capacitors.

26. An integrated circuit as recited in claim 20, further comprising a second capacitor, the second capacitor having a first plate coupled to the output port of the other one of said first and second transconductance amplifiers, and a second plate coupled to a reference voltage.

27. An integrated circuit as recited in claim 20, wherein the reference voltage is a common mode reference circuit.

28. A disk drive system for use with a magnetic disk on which data is stored, the disk having an inner diameter and an outer diameter, the disk having a bit pattern that varies in frequency from the inner diameter to the outer diameter so as to record data in a constant bit density wherein said system includes an integrated circuit having a biquadratic filter the transfer function of which has a pair of zeroes in the numerator and a pair of complex conjugate poles in the denominator, the biquadratic filter for receiving an input signal and providing a filtered output signal, the integrated circuit comprising:

a first circuit for constructing the complex conjugate poles of the filter transfer function, the first circuit having an input for receiving the input signal and an output at which an output current representative of a filtered signal is presented, the first circuit having first and second operational transconductance amplifiers, each of said first and second transconductance amplifiers having first and second input ports and an output port, the first transconductance amplifier receiving the input signal at the first input port thereof and providing an output signal at the output port thereof, the second transconductance amplifier having the output port of the first transconductance amplifier coupled to the first input port thereof for receiving at the first input port the output signal from the first transconductance amplifier, the second transconductance amplifier providing at the output port thereof an output signal including an output current, the output port of the second transconductance amplifier coupled to the second input port of both the first and second transconductance amplifiers to provide the output signal from the second transconductance amplifier as a second input to both the first and second transconductance amplifiers, the first circuit including a capacitor having a first plate and a second plate, the first plate coupled to the output port of one of said first or second transconductance amplifiers, the second plate couple to a reference voltage; and a second circuit for constructing the zeroes of the filter transfer function, independent of the poles, the second circuit having an input coupled to the first input port of the first circuit for receiving the input signal, the second circuit including a differentiator for differentiating the input signal to produce a differentiated input signal, the second circuit providing an output current summed with the output current of the first circuit to produce the filter output, the second circuit output current being proportional to the differentiated input signal, whereby the filter pole frequencies determined by the first circuit are independent of the filter gain determined by the second circuit.

29. A disk drive system as recited in claim 28, further comprising an attenuator interposed between the input and the differentiator, the attenuator introducing attenuation, whereby the attenuation controls the relative location of the zero pair.

30. A disk drive system as recited in claim 29, wherein the attenuator introduces a negative gain, whereby the magnitude of the gain determines the magnitude of boost.

31. An integrated circuit as recited in claim 28, wherein the reference voltage is a common mode reference circuit.

* * * * *